United States Patent [19]

Harris et al.

[11] 4,069,659
[45] Jan. 24, 1978

[54] ELECTRONIC SWITCH ACTIVATED BY CURRENT FLOW THROUGH THE HUMAN BODY

[76] Inventors: Phillip A. Harris, 521 N. Camden Drive, Beverly Hills, Calif. 90210; Charles W. Rutledge, 5003 N. Ardsley Drive, Temple City, Calif. 91780

[21] Appl. No.: 650,310

[22] Filed: Jan. 19, 1976

[51] Int. Cl.² ............. G04B 37/12; G06C 7/02; G06F 7/38; G08B 21/00
[52] U.S. Cl. ............. 58/152 R; 58/23 R; 200/DIG. 2; 235/145 R; 307/116; 340/279; 364/709
[58] Field of Search ............. 58/23 R, 58 R, 152 R, 58/55; 128/2.05 DZ; 200/DIG. 2, 159 B; 235/145 R, 156; 307/116, 117; 340/279, 364 R, 364 C

[56] References Cited

U.S. PATENT DOCUMENTS

| | | | |
|---|---|---|---|
| 3,244,369 | 4/1966 | Nassimbene | 340/365 C |
| 3,482,241 | 12/1969 | Johnson | 340/365 C |
| 3,803,834 | 4/1974 | Reese | 58/152 R |
| 3,812,384 | 5/1974 | Skorup | 307/251 |
| 3,931,632 | 1/1976 | Uchida et al. | 307/304 |
| 3,941,989 | 3/1976 | McLaughlin et al. | 235/156 |
| 3,944,843 | 3/1976 | Martins | 307/116 |
| 3,955,355 | 5/1976 | Luce | 58/152 R |
| 3,973,255 | 8/1976 | Freeman | 340/365 E |
| 3,975,899 | 8/1976 | Haber | 58/88 R |

*Primary Examiner*—E. S. Jackmon
*Attorney, Agent, or Firm*—Edwin A. Oser

[57] ABSTRACT

An electronic circuit having two states, at least one of which is stable and which permits information to pass from one terminal to the other. The circuit can be activated by the flow of a minute electric current through the human body. The circuit is particularly suitable for any hand-held instrument such, for example, as an electronic calculator watch of the digital type and including electronic logic. It permits to activate certain functions or to carry out certain calculations by activating a conductive surface by means of a hand-held metallic pin or the like. This makes it possible to provide a large number of functions or operations and to display numbers say on the face of a watch and to activate each one by touching it with a pin held by the wearer of the watch or instrument.

15 Claims, 10 Drawing Figures

ELECTRONIC SWITCH ACTIVATED BY CURRENT FLOW THROUGH THE HUMAN BODY

BACKGROUND OF THE INVENTION

This invention relates generally to an electronic circuit of the type having two states and particularly relates to such a circuit capable of being activated by the passage of a minute electric current through the human body.

It has long been recognized that the size of electronic hand-held calculators is limited strictly by the size of the pushbuttons needed to actuate the electronic circuits. Since the size of the human digit cannot be reduced, neither can the size of the buttons which activate the circuit.

Hence, in accordance with the present invention, an electronic circuit is provided which has two states, at least one of which is a stable state. This circuit can be activated by the passage of an electric current through the human body, the current having a magnitude on the order of a few nanoamperes. Hence, such a circuit when held by the user can be activated by a conductive pin or the like, whereby the current flows between the circuit and the pin through the body of the wearer.

Switches which can be activated by the human touch have been proposed before. For example, certain elevator call buttons are of this type. When they are touched by a person the button is activated by the body capacitance to ground or earth. Other switch mechanisms are known which utilize the stray electromagnetic fields such as those generated by a 60 hz electric line.

On the other hand, the conventional mechanical switches which are presently utilized for controlling handheld electronic calculators have certain disadvantages. They contain moving parts, including springs, levers, knobs and depressable buttons. As a result, the switches have a finite lifetime and after a given number of operations the moving parts break or suffer excessive wear so they are no longer useable. As pointed out before, it is difficult and expensive to miniaturize mechanical switches. Besides, if they are too small, they can no longer be operated by a human operator.

Other mechanical switches are also known which offer certain advantages over the mechanical switch above described. This new type switch is called a conductor loaded elastomeric switch. However, the elastomeric switches have a characteristic of the key pressure versus contact resistance which can generate continuous noise low pressure key depressions. The certainty of conduction of an elastomeric switch is a function of the applied pressure. This is even more critical than for the conventional mechanical switches.

In contrast the electronic switch of the present invention can be made extremely small and requires no contact pressure beyond that needed to cause an electric current to flow. The current needed for activating this type of switch is on the order of 5 nanoamperes. A publication by Peter Strong entitled "Biophysical Measurements" published by Textronix, Inc., Oregon in 1970, states on pages 255 – 259 what the current threshold is for electric shock under certain conditions. For example, experiments have shown that up to 300 microamperes can be applied to the surface of the body such as from one arm to the other. Such currents are reasonably safe for most subjects. Much smaller currents can be tolerated where the current is applied internally to the body. In this case, the current may flow via the arterial system directly to the heart. In that case, a current of 15 microamperes is considered a safe upper limit. It should be noted in accordance with the present invention the current needed to activate the circuit is no more than a fraction of a microampere which is orders of magnitude below the safe upper limit of currents applied to the human body.

It is accordingly an object of the present invention to provide an electronic switch suitable for hand-held instruments such as calculators and the like which have no moving parts.

A further object of the present invention is to provide such an electronic circuit which can be readily activated by the operator by means of a conductive pin or the like.

Another object of the present invention is to provide a circuit of the type discussed which is inexpensive in manufacture and suitable for use with electronic instruments.

Still a further object of the present invention is to provide an electronic circuit which can be readily activated and which is particularly suitable for miniaturized applications.

SUMMARY OF THE INVENTION

In accordance with the present invention there is provided an electric switch of the type having two states, at least one of which is stable. Hence, the circuit, when activated, will permit information to pass from one terminal to the other. Thus, the circuit operates like a combination of electronic switch and relay. Many electronic switches are suitable for this purpose such, for example, as those utilizing field effect transistors. These circuits are available in integrated form under the name COS-MOS, sometimes referred to as C-MOS, which stands for complimentary symmetry metal oxide semiconductors. Other integrated circuits which are suitable for this purpose are known as integrated injection logic circuits ($I^2L$). Other components which are suitable are low leakage bipolar transistors, junction field effect devices, low voltage vacuum tubes and the like. Such devices may either be in discrete or integrated circuit form.

The circuit comprises an electronic switch, as well as a voltage source having two terminals for energizing the switch. The circuit further has a data input and a data output terminal.

The electronic switch has a conductive casing and is adapted to be in contact with the body of a person. One of the terminals of the voltage source is connected to the conductive casing.

The electronic circuit has an additional terminal for activating it, that is for switching the circuit from one of its states to the other. The other terminal of the voltage source is connected to the switching terminal through a resistor having a large resistance.

Finally, an additional resistor is connected between the switching contact and an output terminal. Hence, when the wearer of the electronic switch contacts the output terminal with a conductive element, a very small current will flow through the wearer to activate the circuit and switch it from one state to the other. This in turn will permit at will information to flow between the data terminals.

The novel features that are considered characteristic of this invention are set forth with particularity in the appended claims. The invention itself, however, both as

DESCRIPTION OF THE PREFERRED EMBODIMENTS

Figure 1:
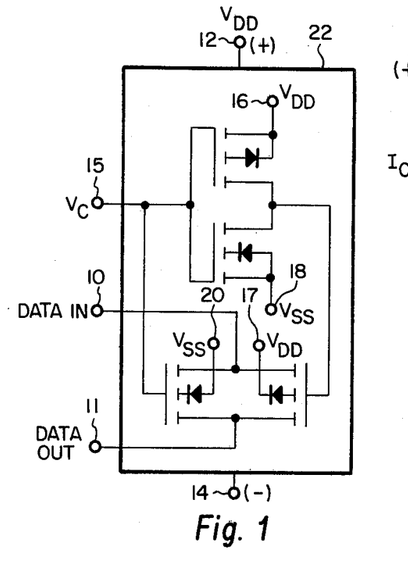
FIG. 1 is a circuit diagram of an electronic circuit in accordance with the present invention and illustrated by way of example, the circuit consisting of field effect transistors.

Referring now to the drawings wherein like elements have been designated by the same reference numbers and particularly to FIG. 1, there is illustrated a typical bilateral switch in accordance with the present invention. As explained hereinbefore, this may, for example, consist of a C-MOS integrated circuit having a plurality of field effect transistors. Alternatively, other circuits could be used as explained hereinabove. To reiterate, other suitable circuits are low leakage, bipolar transistors, low voltage vacuum tubes, as well as integrated injection logic circuits. However, the circuit illustrated in FIG. 1 may consist of ¼ of a CM 4016AE available from Solitron.

The circuit has a data input terminal 10 and a data output terminal 11. It is energized by applying a voltage between a positive terminal 12 identified by $V_{DD}$ and a negative terminal 14 identified by $V_{SS}$. Finally, a terminal 15 identified by $V_C$ is the control terminal which controls the operation. It should be noted that the circuits illustrated in FIGS. 1 - 5 are monostable circuits, that is they have two states, one of which is stable. A monostable circuit may be arranged to be normally open or closed. It is also feasible to utilize a bistable circuit which has two stable states. This may readily be obtained by a conventional latching circuit which is a feedback circuit maintaining the system in its normally unstable state.

The positive voltage applied to terminal 12 is internally applied to terminals 16 and 17, while the negative voltage from terminal 14 is applied to terminals 18 and 20. Without going into the details of operation, the structure between the terminal 16, 18 may be considered to be an inverter, which in turn energizes the structure shown between the terminals 17 and 20 which is not directly energized by the voltage applied to terminal 15. Hence, when the circuit is energized by the application of a suitable voltage to terminal 15, that is the control terminal the data is permitted to flow between data input terminal 10 and data output terminal 11.

What has been symbolically and schematically illustrated within the rectangle 22 is a plurality of field effect transistors, each having a gate, a drain and a source. It will be evident that the field effect transistors may be either P-type or N-type as desired.

The circuit of FIG. 1 can be arranged to be closed or on when the voltage applied to terminal 15 is 0.7 of the positive voltage $V_{DD}$ minus the negative voltage $V_{SS}$. On the other hand, the circuit is off or open when the control voltage applied to terminal 15 is 0.3 times the positive voltage $V_{DD}$ less the negative voltage $V_{SS}$. For convenience, the negative voltage $V_{SS}$ may be made ground or zero. In that case, the circuit will switch when the control voltage changes from 0.7 of the positive voltage to 0.3 of the positive voltage.

How this typical circuit can be used in accordance with the present invention will now be explained in connection with FIGS. 2 - 5. Hence, reference is now made to FIG. 2 showing a normally open switch utilizing the circuit of FIG. 1.

Figure 2:
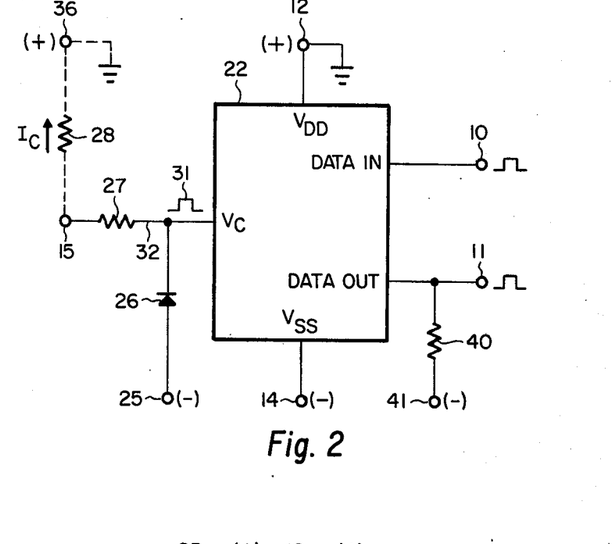
FIG. 2 is a simplified circuit diagram of the circuit of FIG. 1 of a normally open switch arranged in accordance with the present invention and activated by a current flowing through the body of the wearer.

There is shown again in FIG. 2 the rectangle 22 corresponding to the same rectangle of FIG. 1. In accordance with the present invention a negative terminal 25 is connected to the terminal 15 through a reverse biased diode 26 and a resistor 27. Instead of utilizing a reverse biased diode 26, it is also feasible to provide a suitable resistor of large resistance. As explained before, the circuit of FIG. 2 represents a normally open switch. The switch can be closed by causing a positive current to flow out of the terminal 15. The direction of the current shown by the arrow adjacent the control current IC is the direction of the electron flow; the conventional direction of current flow is opposite.

In accordance with the present invention this may be effected by connecting the terminal 15 to ground which is the positive terminal $V_{DD}$. The current flows through a resistor 28 which is the resistance of the body of the wearer. The electron current $I_C$ or the negative current flows from terminal 15 to the positive terminal which may be designated 30 through the body of the wearer. As a result, a positive pulse 31 appears at the lead 32 connected to the $V_C$ terminal, that is to the control terminal of the circuit.

Hence, the switch of FIG. 2 may be activated by connecting the positive terminal 12 to the body of the wearer, for example, by a metallic or conductive casing in which the circuit is enclosed. The current $I_C$ may then be caused to flow by touching the terminal 15 with a conductive element, such as a metallic pin or needle or the like.

The current is limited by the leakage current through the reverse biased diode 26 which amounts to 5 nanoamperes. The resistance of the reverse biased diode 26 is about 2000 megohms and, as stated before, the diode may be replaced by a suitable resistor. However, for use in an integrated circuit a diode is preferred because it can be more readily realized rather than a large resistance which would require a long resistive path.

As indicated before, the circuit of FIG. 2 is a monostable circuit. In other words, it has a single stable state and an unstable state. However, the unstable state may also be converted to a stable state by a latching circuit.

It should also be noted that the circuit of FIG. 2 may be used as a rotary switch. In this case, a plurality of circuits may be provided, each having a data input terminal 10. However, the various circuits have their data output terminals 11 connected together. Hence, only the data from the activated circuit will be obtainable at the output lead.

Figure 3:
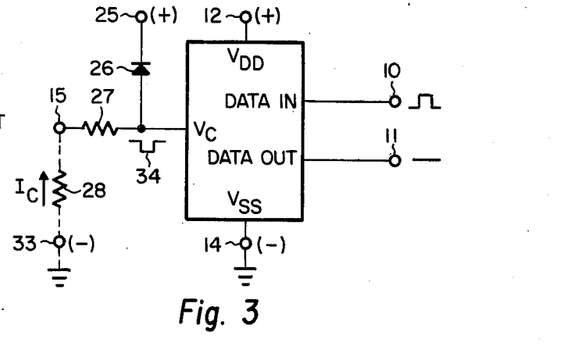
FIG. 3 is a circuit diagram of a normally closed switch similar to that of FIG. 2 but arranged with an activating current with opposite polarity.

Instead of providing a normally open switch it is also feasible to provide a normally closed switch and such a circuit has been illustrated in FIG. 3. In the circuit of FIG. 3 the negative terminal 14 is grounded. The diode 26 is reverse biased and connected to a positive terminal 25 as shown. The circuit is opened or deactivated by causing a negative current $I_C$ to flow into the terminal 15 through the body resistance 28 from ground, that is from the ground terminal 33. As a result, a negative going pulse 34 appears at the input $V_C$, that is the control voltage input. As shown in FIG. 3, when the circuit is deactivated, the switch is opened so that there is no output at the data output terminal 11.

Instead of grounding the positive terminal $V_{DD}$ as shown in FIG. 2, it may be preferred to ground the negative terminal $V_{SS}$ as shown in FIG. 3. However, it may still be desired to utilize a normally open switch of the type shown in FIG. 2 rather than a normally closed switch as illustrated in FIG. 3.

Figure 4:
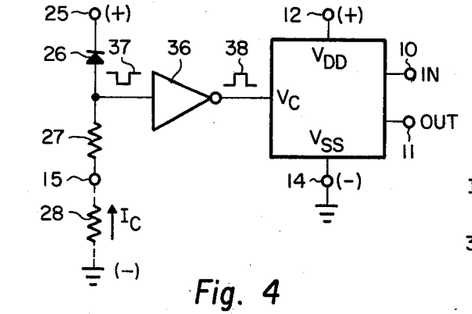
FIG. 4 shows again the circuit of FIG. 2 and including an inverter, whereby the circuit can be activated with the same polarity as the circuit of FIG. 3.

This can readily be accomplished by the circuit of FIG. 4 which makes use of an inverter 36 connected to the reverse biased diode 26 connected in series with the resistor 27 and the input terminal 15. Hence, if a current is allowed to flow through the body of the wearer and through the body resistance 28, a negative current $I_C$ will flow from ground which is the negative terminal through resistors 28, 27, diode 26 to the positive terminal 25. As a result, a negative going pulse 37 will appear at the input of the inverter 36 which in turn will generate a positive going input pulse 38. This then will close the normally open switch in the manner previously described in connection with FIG. 2.

Figure 5:
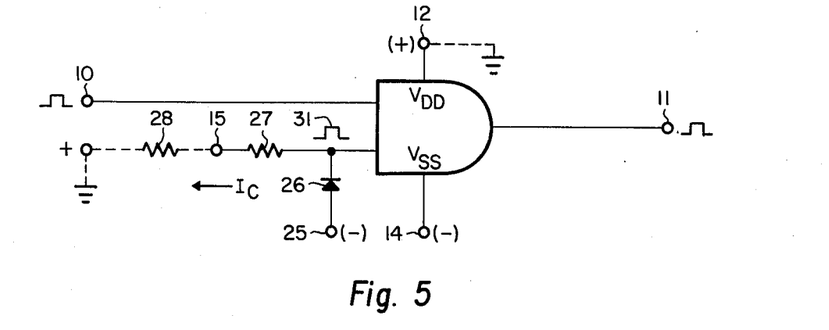
FIG. 5 shows an AND gate utilizing the electronic circuit of the invention.

Another example of the use of the basic switching circuit of the invention is illustrated in FIG. 5. Here the circuit is arranged as a logical AND circuit. The circuit of FIG. 5 is basically like that of FIG. 2 except that it is arranged as an AND circuit. It may consist of an MC14081AL integrated circuit available from Motorola. The data appearing at the data input terminal 10 will only be permitted to pass the AND circuit and to appear at the output terminal 11 if the control input terminal 15 is high, that is if a positive going pulse 31 appears at that input.

As explained in connection with FIG. 2, this may readily be achieved by grounding the positive terminal 12 and connecting the control terminal 15 to ground through the body resistance 28.

As shown in FIG. 2, a pull down resistor 40 may be connected between a negative terminal 41 and the data output terminal 11. I will be understood that such a pull down resistor 40 may not always be required. However, such a pull down resistor may be required because there is always a certain amount of leakage current through the channel of the field effect transistors. This current is typically on the order of 10 pico-amperes.

It will be understood that the circuit specifications of the bistable circuit of FIGS. 2 – 5 of the invention may vary according to the design for any particular application. The following circuit specifications are included by way of example only for a C-MOS unit:

Diode 26; Type IN4035
In lieu of diode 28; 22 M ohms
Voltage between terminals 12 and 14; 9 Volts DC
Resistor 27; 100 K ohms
Resistor 40; 20 K ohms One of the important features of the present invention is that it lends itself for use in combination with an electronic digital watch of the type having a crystal-controlled oscillator and an electronic calculator. In this case, the digital display of the watch can be used at the users choice alternately for displaying time and date information or for exhibiting the results of a particular arithmetic operation. Hence, the digital display of the watch which is already present can be made use of, as well as the control logic for the display.

In view of the fact that integrated circuits take up very little space the additional functions and operations can readily be accommodated in the limited space of a wrist watch.

The problem of actuating many circuits corresponding to the 10 digits, a number of arithmetic functions and the like, has been solved by the invention because all that is necessary to acutate a circuit is to touch a particular place with a conductive element.

Figure 6A:
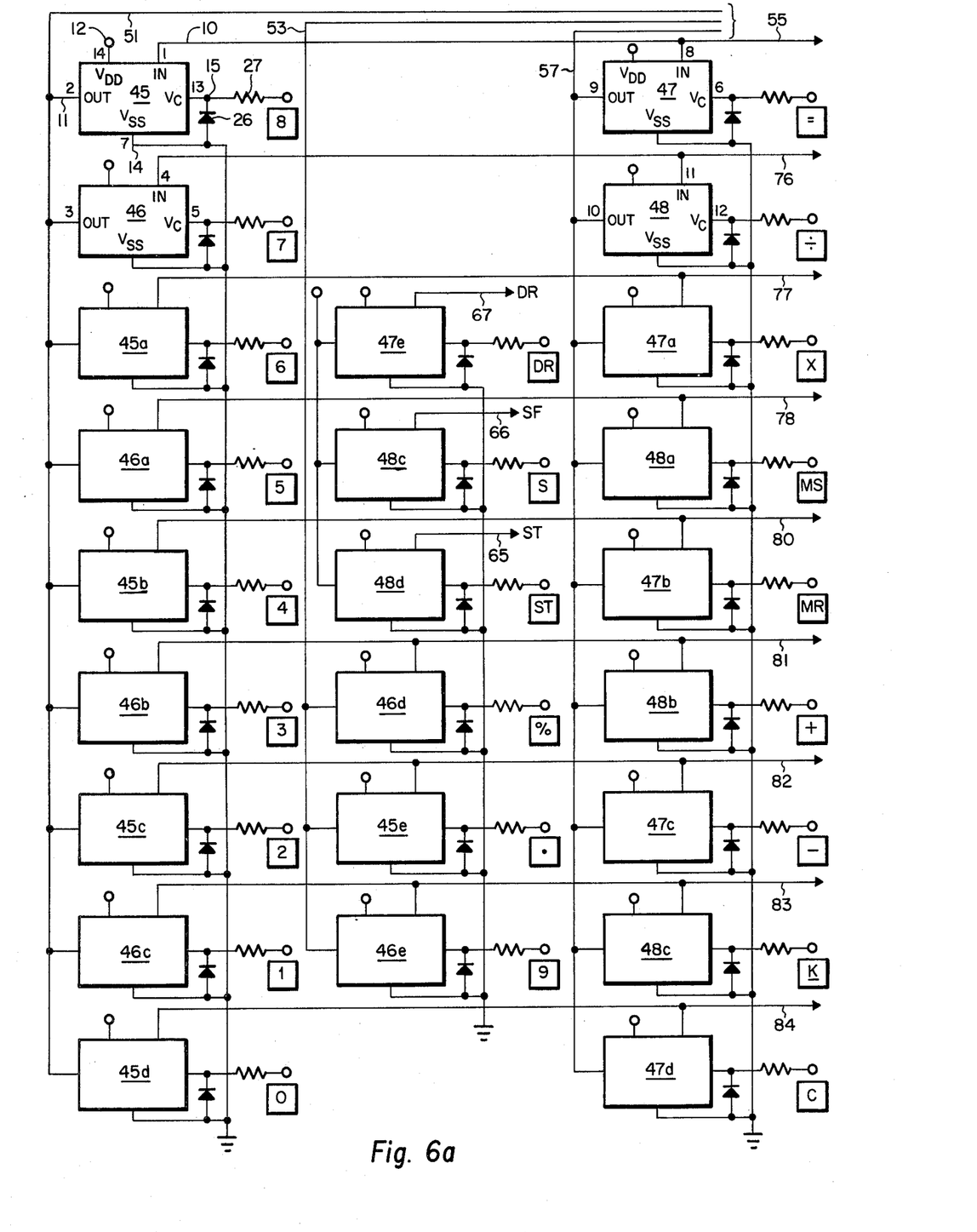
FIGS. 6a and 6b illustrate, by way of example, a plurality of electronic circuits in accordance with the present invention suitable for use with a digital watch having a calculator to provide additional arithmetic functions capable of being exhibited by the digital display of the watch.
Figure 6B:
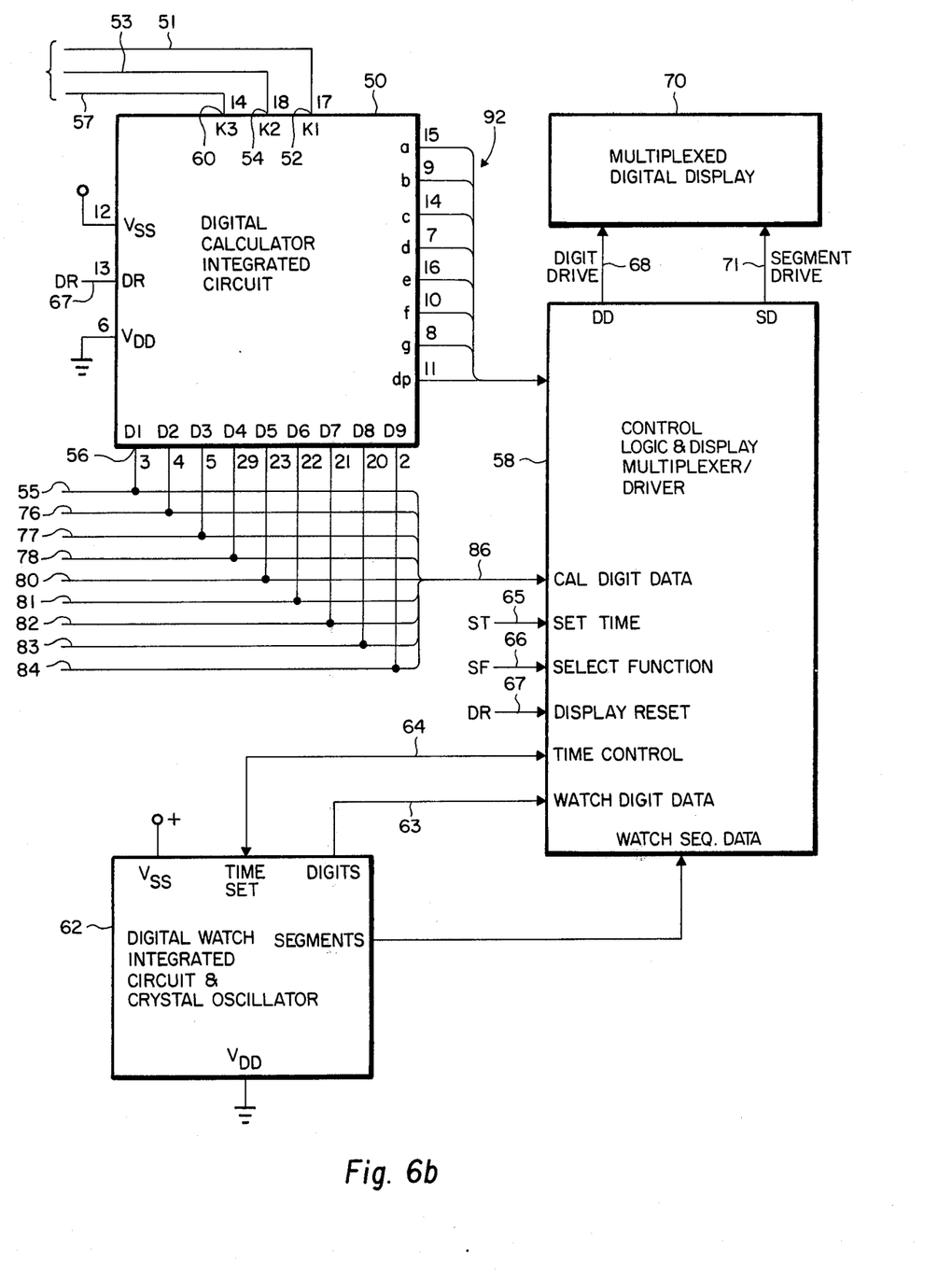

Such a circuit has been shown, by way of example, in FIG. 6a, 6b to which reference is now made.

As explained hereinbefore, any one of the circuits of FIGS. 1 – 4 may be represented by ¼ of an integrated chip of the type CM 4016AE. Accordingly, in FIG. 6a there are shown multiples of four such units 45, 46, 47 and 48. All told the circuit illustrated in FIG. 6a has 24 such units which may consist of chips or the equivalent. Each of the units 45 – 48 corresponds to the circuit of FIG. 2. In other words, this is a normally open switch where the positive terminal is connected to the casing of the watch. In this connection it will be understood that ground is simply a common reference potential which in this case may be simply the potential of the skin of the wearer.

Thus, by way of example, the block 45 has been provided with the same reference numerals as the circuit of FIG. 2. Since all of the 24 units are identical, there is no need to describe any of them in detail. However, the six groups of four units each have been respectively numbered 45 through 48, 45a – 48a, 45b – 48b, 45c – 48c, 45d – 48d, 45e – 48e and the digits 0 – 9 correspond respectively to the units 45d, 46 c, 45c, 46b, 45b, 46a, 45a, 46, 45, and 46e. In other words, by energizing or activating the contacts corresponding to the numbers 0 – 9 shown in a square, the corresponding numbers are energized and outputted into a calculator circuit 50. This is an integrated circuit forming a digital calculator. Such circuits are readily available, for example, from National Semiconductor Type MM 5738. Their description is found in a phamplet obtainable from National Semiconductors, Santa Clara, Calif. The outputs of digits 0 – 8 are obtained from lead 51 which is connected to an input terminal 52 of the calculator 50. The corresponding numbers of the terminals on the actual chip are also shown. The output of digit 9 appears on output lead 53 which is connected to input 54 of the block 50.

The calculator shown by way of example in FIGS. 6a and 6b, includes six arithmetic functions. Thus, the block 48b provides the adding function, while the block 47c corresponds to the subtraction function. The block 47a controls the multiplication, while the block 48 governs the division. The block 47 corresponds to the equal (=) sign and the block 45e corresponds to the floating decimal point. The block 47d corresponds to the percentage (%) operation. Finally, the block 48c permits to introduce a constant as shown by the symbol K.

Particular additional operations can also be performed. Thus, the block 47e is labelled DR corresponding to display reset. The block 48e is characterized by an S to indicate the select function. Block 48d has to do with memory storage as shown by MS. Block 47b is labelled MR to correspond to the memory recall. The block 47d controls the clear, that is clearance of the display register and any erroneous keyboard entries. Thus, there are 10 digits, 7 arithmetic functions and 7 other operations for a total of twenty-four controls which can be activated by the control terminal 15 in the manner previously outlined.

In addition to the block 47e, the blocks 46d and 45e are connected to the output lead 53. The lead 55 is connected to the terminal 56 of the calculator 50 and also to the input of a control logic 58. It is also connected to the inputs of the blocks 45 and 47. Also, the lead 57 is connected to the outputs of blocks 47, 48, 47a, 48a, 47b, 48b, 47c, 48c and 46d. The lead 57 in turn is connected to the input 60 of the calculator 50.

The control logic and display multiplexer driver forms part of a normal digital watch having a crystal-controlled oscillator and some electronic control logic. Hence the digital watch integrated circuit and crystal oscillator 62 forms part of a normal digital watch. It has a output lead 63 which develops the digital data impressed on the block 58. The time control is effected by the lead 64 interconnecting units 62 and 58. The unit 58 also has three input leads 65 for setting the time which originates from the block 48d, the select function obtainable from lead 66 of block 48e and the display reset on lead 67 obtainable from block 47e. The output of the control logic 58 is obtainable from lead 68 which is the digit drive. This determines which of the digits of the digital display 70 is activated. The segment drive obtainable from lead 71 determines which of the seven segments of each digit are actuated to show a particular number.

A number of input leads 55, 76, 77, 78, 80, 81, 82, 83 and 84 are connected to various input terminals of the digital calculator 50. They are also connected to the control logic 58 to produce the calculated digit data s shown by the input lead 86. The leads 55 and 76 – 88 and 80 – 84 form the inputs of units 45 and 47, 46 and 48, 45a and 47a, 46a and 48a, 45b and 46b, 46b and 46d and 48b, 45c and 45e and 47c, 46c and 46e and 48c, 45d and 47d.

How the calculations are actually performed is well known in the art and need not be further described herein. In this connection reference is again made to the descriptive pamphlet of the MM 5738 calculator previously referred to.

Figure 7:
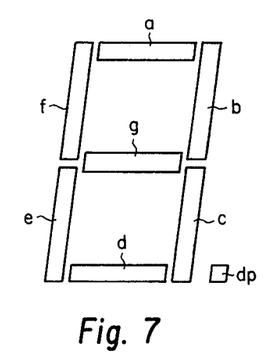
FIG. 7 shows by way of example the arrangement of the light emitting diodes or liquid crystals which are conventionally used with a digital display to indicate all numbers between 0 and 9.

It will be noted that the calculator 50 and the oscillator 62 have energizing terminals $V_{SS}$ and $V_{DD}$ as previously described. The calculator 50 also has an input lead 67 connected to the lead 67 of the unit 47e. This will deliver the display reset information. At the same time as previously indicated, this lead is also connected to the display reset input of the control logic 58. The output leads generally designated 92 of the calculator 50 are connected to the control logic 58. They serve the purpose to deliver the segment drive information. This is the information which energizes one or more of the seven segments corresponding to seven light emitting or liquid crystal diodes which determine which number is exhibited in each of the digital display outputs. This information also energizes the decimal point as needed. FIG. 7 shows the decimal point at dp.

Referring now to FIG. 7, there are shown the seven segments which are labelled $a - g$ and the decimal point dp which provide the desired output numbers. Each of the segments is represented by a light emitting diode or liquid crystal and can be selectively energized to provide the numerals from 0 – 9.

Figure 8:
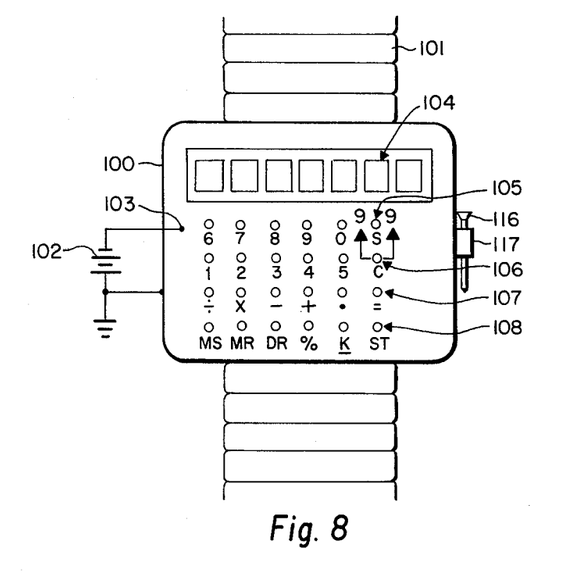
FIG. 8 is a view on enlarged scale of a digital watch in accordance with the present invention and provided with a watch face having a plurality of apertures for activating the calculator with the numerals from 0 - 9 and for generating various arithmetic functions and operations.
Figure 9:
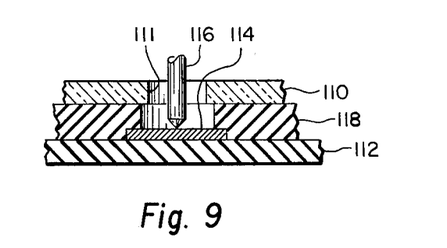
FIG. 9 is a cross-sectional view on enlarged scale taken on line 9 — 9 of FIG. 8 to illustrate the construction of the activating apertures with their conductive strips.

Referring now to FIGS. 8 and 9, there is illustrated a watch case 100 consisting of a conductive material such as a metal case. The watch case 100 may be provided with a conventional watchband 101 which preferably also is a conductive material such as metal. The metallic watch case 100 and watchband 101 will establish a good electric contact with the body of the wearer.

By way of example, there is illustrated the voltage source 102 having its positive terminal connected to the watch case 100, that is to ground. The negative terminal of the battery 102 is connected in a suitable manner to the integrated circuit or circuits as indicated by the connection 103. The watch is provided with a digital display 104 which may consist of a suitable number of positions for digits. In the case illustrated in FIG. 8, there are seven such windows, each of which contains seven light emitting diodes or the like having a configuration as shown in FIG. 7. The watch face is provided with four rows of openings or apertures, each row having six openings. Hence, there is a total of twenty-four such openings corresponding to the twenty-four units or electronic switches of FIG. 6a. The first five openings of the top row 105 and the next row 106 are utilized for the ten digits of the decimal system. The next row 107 of six openings is used to control arithmetic functions such as division, multiplication, subtraction, addition, decimal point (floating) and the equal sign. The last row 108 is respectively for the following functions: memory store (MS), memory recall (MR), display reset (DR), percent, constant (K) and set time (ST). Finally, the last aperture in the top row 105 selects a function (S) and the aperture in the next row 106 directly below S is for clearing the register (C).

It will be noted that all of these functions correspond to those shown in FIG. 6a.

The respective number or function or arithmetic operation may be activated by inserting a pin or stylus through the aperture upon a conductive strip as shown in FIG. 9. Thus, as shown in FIG. 9, there is a watch face 110 which may, for example, consist of glass or a suitable transparent plastic having an aperture 111. Below the watch face 110 is an insulating strip 112 provided with a conductive coating 114. Hence, a pin 116 passing through the aperture 110 will contact the conductive strip 114 which corresponds to the terminal 15 of the circuit of FIG. 2. In a similar manner, all of the 24 numbers, or arithmetic operations or functions can be activated. A waterproofing material 118 such as rubber may be provided between the watch face 110 and the insulating strip 112 or the coating 114 so that the space below the aperture 111 remains accessible to the pin 116.

In order to energize a particular circuit any conductive element such as a pin, a needle, a paper clip, a ball point pin or the like may be used. Preferably, however, a special pin 116 may be provided on the watch case 100 and may be retained by a retainer 117 of cylindrical form. If desired, the pin 116 may be made magnetic to minimize the danger of loss. However, if the pin should be lost any other conductive object with a thin point may be used instead.

As explained hereinbefore, the electric current that flows through the body of the wearer, that is between the arm to which the watch is attached and the hand which holds the pin, is on the order of 5 nanoamperes. This is orders of magnitude smaller than the allowable maximum current which may flow internally through the body and the heart. It should be noted in this connection that integrated circuits of the type herein contemplated usually require currents on the order of picoamperes.

There has thus been disclosed an electronic switch or relay capable of being activated by an extremely small current flowing through the body of a person. Hence, the circuit is particularly applicable to any instrument capable of being held by the hand of the operator while being used. A prime example of such an instrument is a digital watch of the type having a crystal-controlled oscillator and a calculator for determining time, dates, and the like. The circuit of the present invention may then be used as a digital calculator which uses the digital display of the watch and at least a portion of the control logic and multiplex display of such a watch. The circuit is characterized in that it does not require mechanical push buttons for its actuation, but rather can be operated by inserting a pin-like conductor, whereby the electric current is completed through the body of the operator. In general, the circuit of the invention permits the further miniaturization of electronic calculators and the like. In the past, the size of such calculators was primarily determined by the size of the push buttons which cannot be made smaller than the digits of the human hand.

Wht is claimed is:

1. An electronic circuit having two states, at least one of which is stable for permitting information to pass from one terminal to the other, said circuit comprising:
  a. an electronic switch;
  b. a voltage source having two terminals for energizing said switch;
  c. said circuit having a data input terminal and a data output terminal;
  d. said electronic switch having a conductive member adapted to be in contact with the body of a wearer;
  e. said voltage source having one of its terminals connected to said conductive member;
  f. said electronic circuit having a control contact for activating it and for switching said circuit from one of its states to the other, the other terminal of said voltage source being connected to said control contact through a first resistor of large resistance; and
  g. an additional resistor connected between said control contact and an output terminal, a junction point being defined between said resistors and said control contact, whereby when the wearer of the electronic switch contacts said output terminal a very small current will flow through the wearer to activate said circuit and switch it from one state to the other.

2. A circuit as defined in claim 1 which consists of a C-MOS bilateral integrated structure.

3. A circuit as defined in claim 1 wherein the positive terminal of said voltage source is connected to said member.

4. A switch as claimed in claim 3 wherein said switch is normally open and is of the monostable type.

5. A circuit as defined in claim 1 wherein the negative terminal of said voltage source is connected to said member.

6. A circuit as defined in claim 5 wherein said switch is normally closed and is of the monostable type.

7. A circuit as defined in claim 1 wherein said first resitor consists of a back biased diode.

8. A circuit as defined in claim 1 wherein a pulldown resister is connected between one terminal of said voltage source and the data output terminal.

9. A circuit as defined in claim 1 wherein an inverter is provided between the junction point of said resistors and said control contact.

10. In a portable instrument capable of being in contact with the body of the wearer during operation, an electronic circuit, said electronic circuit comprising:
  a. an electronic switch having two states, at least one of which is a stable state, said electronic circuit having at least one data input terminal and one data output terminal;
  b. a source of voltage having two terminals;
  c. said instrument having a conductive casing, one terminal of said voltage source being connected to said casing;
  d. an insulating panel disposed in said casing and having apertures therethrough;
  e. said circuit having one control terminal, said control terminal including a conductive portion recessed in an aperture of said insulating panel;
  f. a resistor connected between the other terminal of said voltage source and said control terminal, whereby when the wearer contacts said control terminal, a current will flow through the body of the wearer to cause the voltage of said control terminal to approach that of the other terminal of said voltage source, thereby to trigger said circuit to its other state.

11. In combination with a digital watch capable of being in contact with the body of a wearer during operation;
  a. said watch including a crystal-controlled oscillator;
  b. a control logic coupled to said oscillator;
  c. a multiplexed digital display;
  d. a first digital calculator having control terminals for the digits from zero to 9, a plurality of predetermined mathematical functions and a plurality of additional operations including a memory storage, memory recall and the like;
  e. each of said digits functions and operations being energizable by an electronic circuit having two states, at least one of which is a stable state;
  f. each of said electronic circuits including a data input terminal and a data output terminal;
  g. a voltage source having two terminals;
  h. said watch and calculator having a common conductive casing, one terminal of said voltage source being connected to said casing, said circuit including a control terminal;

i. a resistor connected between the other terminal of said voltage source and said control terminal;

j. an additional resistor connected in series with said control terminals, whereby a current through the body of the wearer can be made to flow by contacting the control terminal;

k. a metallic element to switch said electronic switch into the other one of its states to permit data to pass therethrough; and l. a second digital calculator coupled to said electronic circuits and having its output coupled to said didgital display for displaying the result of a calculation.

12. The combination defined in claim 11 wherein said digital watch is provided with a watch face having a plurality of openings corresponding in number to the numbers from zero to 9 and the desired functions and operations, whereby each number or function or operation can be activated by inserting a conductive element through said aperture to activate the associated electronic circuit.

13. The combination defined in claim 12 wherein said conductive element consists of a metallic pin capable of passing through said openings in said watch face.

14. In a digital watch of the type including a digital time calculator and a digital calculator:

a. a conductive casing for said watch;

b. a watch face of insulating material having a plurality of openings, each for activating a predetermined function or operation;

c. an insulating layer spaced from and disposed below said watch face; and d. a plurality of conductive layers on said insulating layer, each being associated with one of said openings for energizing a circuit associated therewith by contacting said conductive layer through said one of said openings with a conductive element.

15. In a digital watch of the type including a digital time calculator and a digital calculator;

a. a conductive casing for said watch;

b. a watch face having a plurality of openings, each for activating a predetermined function or operation;

c. an insulating layer spaced from said watch face;

d. a plurality of conductive layers on said insulating layer, each being associated with one of said openings for energizing a circuit associated therewith by contacting said conductive layer with a conductive element;

e. a metallic pin; and f. means for removably securing said pin to said casing, said pin being capable of contacting a selected conductive layer through its associated opening.

* * * * *